United States Patent
Liu et al.

(10) Patent No.: US 9,362,920 B2
(45) Date of Patent: Jun. 7, 2016

(54) CORRECTION CIRCUIT AND REAL-TIME CLOCK CIRCUIT

(71) Applicant: Huawei Technologies Co., Ltd., Shenzhen, Guangdong (CN)

(72) Inventors: Jinxiu Liu, Shenzhen (CN); Shubao Guo, Shenzhen (CN); Ding Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 238 days.

(21) Appl. No.: 14/194,291

(22) Filed: Feb. 28, 2014

(65) Prior Publication Data

US 2014/0247072 A1   Sep. 4, 2014

(30) Foreign Application Priority Data

Mar. 1, 2013  (CN) .......................... 2013 1 0067061

(51) Int. Cl.

| | |
|---|---|
| G06F 1/00 | (2006.01) |
| G06F 1/04 | (2006.01) |
| G06F 13/42 | (2006.01) |
| H03K 21/02 | (2006.01) |
| G06F 1/14 | (2006.01) |
| H03L 1/00 | (2006.01) |
| G04G 3/04 | (2006.01) |
| G06F 1/32 | (2006.01) |

(52) U.S. Cl.
CPC ................. *H03K 21/02* (2013.01); *G04G 3/04* (2013.01); *G06F 1/14* (2013.01); *H03L 1/00* (2013.01); *G06F 1/32* (2013.01)

(58) Field of Classification Search
CPC ........................................................ G06F 1/08

USPC .......................................................... 713/500
See application file for complete search history.

(56) References Cited

U.S. PATENT DOCUMENTS

| | | | |
|---|---|---|---|
| 5,771,180 A | 6/1998 | Culbert | |
| 6,304,517 B1 * | 10/2001 | Ledfelt et al. ................... 368/10 |
| 6,747,374 B2 * | 6/2004 | Kouzuma ..................... 307/106 |

(Continued)

FOREIGN PATENT DOCUMENTS

| | | |
|---|---|---|
| CN | 002662308 Y | 12/2004 |
| CN | 101170349 A | 4/2008 |

(Continued)

*Primary Examiner* — Suresh Suryawanshi

(74) *Attorney, Agent, or Firm* — Leydig, Voit & Mayer, Ltd.

(57) ABSTRACT

The present invention provides a correction circuit. The correction circuit includes a frequency dividing circuit, a frequency dividing coefficient operation circuit, a built-in temperature collection circuit, and a power-on and power-off detection circuit. The built-in temperature collection circuit is configured to collect a temperature of the chip; the power-on and power-off detection circuit is configured to detect power-on and power-off of the chip; the frequency dividing coefficient operation circuit is configured to calculate, according to the temperature of the chip collected by the built-in temperature collection circuit when the power-on and power-off detection circuit detects that the chip is powered off, a frequency dividing coefficient, and output the frequency dividing coefficient to the frequency dividing circuit; and the frequency dividing circuit is configured to provide, according to the frequency dividing coefficient output by the frequency dividing coefficient operation circuit, a timing pulse for a real-time clock.

10 Claims, 7 Drawing Sheets

(56) References Cited

U.S. PATENT DOCUMENTS

| | | | |
|---|---|---|---|
| 7,791,418 B2 * | 9/2010 | Gros | 331/44 |
| 7,797,118 B2 * | 9/2010 | Ashburn et al. | 702/89 |
| 7,817,769 B2 * | 10/2010 | Poisner | 375/376 |
| 8,253,456 B2 * | 8/2012 | Karaki | 327/156 |
| 8,823,434 B2 * | 9/2014 | Yasukawa et al. | 327/175 |
| 2008/0222440 A1 * | 9/2008 | Jones et al. | 713/400 |
| 2009/0160569 A1 | 6/2009 | Gros | |
| 2014/0118076 A1 * | 5/2014 | Yasukawa | 331/34 |

FOREIGN PATENT DOCUMENTS

| | | | |
|---|---|---|---|
| CN | 201212907 Y | | 3/2009 |
| CN | 102176112 A | | 9/2011 |
| CN | 202059371 U | | 11/2011 |
| JP | 2002365383 A | | 12/2002 |
| JP | 2004258045 A | | 9/2004 |
| JP | 2008064678 A | * | 3/2008 |
| JP | 2012047705 A | * | 3/2012 |
| JP | 2012234275 A | * | 11/2012 |

* cited by examiner

<Prior Art>

CORRECTION CIRCUIT AND REAL-TIME CLOCK CIRCUIT

CROSS-REFERENCE TO RELATED APPLICATION

This application claims priority to Chinese Patent Application No. 201310067061.5, filed on Mar. 1, 2013, which is hereby incorporated by reference in its entirety.

TECHNICAL FIELD

The present invention relates to an electronic technology, and in particular, to a correction circuit and a real-time clock circuit.

BACKGROUND

Generally, a real-time clock (Real Time Clock, RTC for short) uses a 32.768 kilohertz (KHz) quartz crystal oscillator to provide a timing pulse. Because oscillation frequency output of the 32.768 KHz quartz crystal in the quartz crystal oscillator may have different frequency deviations in different temperatures, for an RTC, a frequency deviation means a time deviation, and the deviation is accumulated with passing of time. Therefore, when the RTC uses the 32.768 KHz quartz crystal oscillator to provide a timing pulse, the frequency deviation of the quartz crystal oscillator must be corrected according to a temperature, so as to achieve high-precision timing.

FIG. 1 is a schematic diagram of a general correction solution. Specifically, a correction solution for correcting frequency of the RTC is as follows: an external temperature sensor 100 collects a surface temperature of a quartz crystal in a quartz crystal oscillator 300 and sends the surface temperature to a micro controller unit (Micro Controller Unit, MCU for short) 200; the MCU 200 acquires a frequency deviation according to an input temperature value, and sends the frequency deviation as a frequency dividing coefficient to an integer frequency dividing circuit 400; the integer frequency dividing circuit 400 acquires a 1 Hz clock signal according to a signal provided by the quartz crystal oscillator 300 and the frequency dividing coefficient acquired from the MCU 200, and sends the clock signal to an RTC 500 for timing.

A major problem in the foregoing correction solution, however, is that, when a chip is powered off and is incapable of supplying power to the external temperature sensor, temperatures fail to be collected. In addition, the operation of the frequency coefficient requires the MCU, which wastes MCU resources.

SUMMARY

Embodiments of the present invention provide a correction circuit and a real-time clock circuit to solve a problem that a chip fails to perform correction according to a temperature when powered off and the operation of a frequency coefficient requires an MCU, which wastes MCU resources.

According to a first aspect, an embodiment of the present invention provides a correction circuit, including a frequency dividing circuit, a frequency dividing coefficient operation circuit, a built-in temperature collection circuit, and a power-on and power-off detection circuit that are all integrated in a chip. The built-in temperature collection circuit is configured to collect a temperature of the chip. The power-on and power-off detection circuit is configured to detect power-on or power-off of the chip. The frequency dividing coefficient operation circuit is configured to: when the power-on and power-off detection circuit detects that the chip is powered off, calculate a frequency dividing coefficient according to the temperature of the chip collected by the built-in temperature collection circuit, and output the frequency dividing coefficient to the frequency dividing circuit. The frequency dividing circuit is configured to provide a timing pulse for a real-time clock according to the frequency dividing coefficient output by the frequency dividing coefficient operation circuit, so that the clock outputs a clock signal according to the timing pulse.

In a first possible implementation manner of the first aspect, a temperature collection control circuit is connected to the real-time clock and the built-in temperature collection circuit, and is configured to control, according to the clock signal output by the real-time clock, the built-in temperature collection circuit to collect the temperature of the chip.

According to the first aspect and the first possible implementation manner of the first aspect, in a second possible implementation manner, the power-on and power-off detection circuit is further configured to detect whether the chip is powered on, and the correction circuit further includes an external temperature collector and a temperature selection circuit. The external temperature collector is configured to collect a temperature of an external quartz crystal of the chip. The temperature selection circuit is connected to the built-in temperature collection circuit, the external temperature collector, the power-on and power-off detection circuit, and the frequency dividing coefficient operation circuit, and is configured to: when the power-on and power-off detection circuit detects that the chip is powered off, output the temperature of the chip collected by the built-in temperature collection circuit to the frequency dividing coefficient operation circuit; and when the power-on and power-off detection circuit detects that the chip is powered on, output a temperature of the quartz crystal collected by the external temperature collector to the frequency dividing coefficient operation circuit.

According to the second possible implementation manner of the first aspect, in a third possible implementation manner, the temperature collection control circuit is further connected to the external temperature collector, and is further configured to control, according to a clock signal output by the real-time clock, the external temperature collection circuit to collect the temperature of the quartz crystal.

According to any one of the first aspect and the first implementation manner of the first aspect, in a fourth implementation manner, a temperature deviation operation circuit is connected to the built-in temperature collection circuit, the power-on and power-off detection circuit, and the frequency dividing coefficient operation circuit, and is configured to: when the power-on and power-off detection circuit detects that the chip is powered off, output the temperature of the chip collected by the built-in temperature collection circuit to the frequency dividing coefficient operation circuit; when the power-on and power-off detection circuit detects that the chip is powered on, perform deviation compensation for the temperature of the chip collected by the built-in temperature collection circuit; and output a temperature acquired by using deviation compensation to the frequency dividing coefficient operation circuit.

According to the first aspect and any one of the first to fourth implementation manners of the first aspect, in a fifth possible implementation manner, the frequency dividing coefficient operation circuit is specifically configured to: acquire, according to a plurality of pre-saved temperatures and a frequency deviation of each temperature relative to a standard oscillation frequency, a frequency deviation corresponding to an input temperature; acquire, according to the frequency deviation corresponding to the input temperature, the frequency dividing coefficient; and output the frequency dividing coefficient to the frequency dividing circuit; where the standard oscillation frequency is a 32768 hertz oscillation frequency of a quartz crystal.

According to the fifth possible implementation manner of the first aspect, in a sixth possible implementation manner, a plurality of the pre-saved temperatures are all higher than a center temperature or all lower than the center temperature, and the center temperature is the temperature corresponding to a center symmetry point in a relationship curve between the oscillation frequency and a temperature of the quartz crystal; and the frequency dividing coefficient operation circuit further includes a comparison circuit, a temperature symmetric circuit, a multichannel selection circuit, a table lookup circuit, and an interpolation operation circuit. The comparison circuit is configured to compare the input temperature with the center temperature. The temperature symmetric circuit is configured to calculate a symmetric temperature of the input temperature related to the center temperature. The multichannel selection circuit is connected to the comparison circuit, the temperature symmetric circuit, and the table lookup circuit, and is configured to: output the corresponding temperature to the table lookup circuit when the input temperature is higher than the center temperature and a plurality of the pre-saved temperatures are all lower than the center temperature or when the input temperature is lower than the center temperature and a plurality of the pre-saved temperatures are all higher than the center temperature; and otherwise, output the input temperature to the table lookup circuit. The table lookup circuit is connected to the multichannel selection circuit and the interpolation operation circuit, and is configured to: look up, according to a received temperature, among a plurality of the pre-saved temperatures and the frequency deviation of each temperature relative to the standard oscillation frequency; and output frequency deviations of two temperatures related to the received temperature, relative to the standard oscillation frequency, to the interpolation operation circuit. The interpolation operation circuit is connected to the table lookup circuit and the frequency dividing circuit, and is configured to: perform, according to the frequency deviations of the two temperatures output by the table lookup circuit, relative to the standard oscillation frequency, interpolation operation to acquire a frequency deviation corresponding to the input temperature; acquire, according to the frequency deviation corresponding to the input temperature, a frequency dividing coefficient; and output the frequency dividing coefficient to the frequency dividing circuit.

According to the first aspect and any one of the first to the sixth possible implementation manners of the first aspect, in a seventh implementation manner, the frequency dividing circuit is a fractional frequency dividing circuit.

According to a second aspect, an embodiment of the present invention provides a correction circuit, including a temperature collection module, a frequency dividing coefficient calculation module, and a fractional frequency dividing circuit. The temperature collection module is configured to collect a temperature.

The frequency dividing coefficient calculation module is connected to the temperature collection module, and is configured to calculate a frequency dividing coefficient according to a temperature collected by the temperature collection module, and output the frequency dividing coefficient to the fractional frequency dividing circuit. The fractional frequency dividing circuit is connected to the frequency dividing coefficient calculation module and an oscillator circuit, and is configured to perform, according to the frequency dividing coefficient, fractional frequency dividing on a frequency output by the oscillator circuit to acquire a timing pulse of a real-time clock.

In a first possible implementation manner of the second aspect, the fractional frequency dividing circuit includes a 2-level Sigma-Delta $\Sigma$-$\Delta$ modulator circuit and an integer frequency divider. A frequency dividing parameter of the integer frequency divider includes 327 and 328. The 2-level $\Sigma$-$\Delta$ modulator circuit is connected to the frequency dividing coefficient calculation module and is configured to perform fractional frequency dividing. The integer frequency divider is connected to the 2-level Sigma-Delta $\Sigma$-$\Delta$ modulator circuit and an oscillator circuit, and is configured to: when a result output by the level-2 $\Sigma$-$\Delta$ modulator circuit is greater than 0, perform 328 frequency dividing on a pulse output by the oscillator circuit by using a frequency dividing parameter 328; and when the result output by the level-2 $\Sigma$-$\Delta$ modulator circuit is smaller than or equal to 0, perform 327 frequency dividing on the pulse output by the oscillator circuit by using a frequency dividing parameter 327.

According to a third aspect, an embodiment of the present invention provides a real-time clock circuit, including real-time clock, and any one of the foregoing correction circuits.

The correction circuit and real-time clock circuit according to the embodiments of the present invention output a clock signal according to the temperature of the chip collected by the built-in temperature collection circuit, when the power-on and power-off detection circuit detects that the chip is powered off. In this way, clock correction may be performed according to the temperature when the chip is powered off. A problem in the prior art that clock correction cannot be performed according to the temperature when the chip is powered off is resolved, and the required frequency dividing coefficient is acquired by the frequency dividing coefficient operation circuit, which saves MCU resources.

BRIEF DESCRIPTION OF DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention more clearly, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

Embodiment 1

Figure 1:
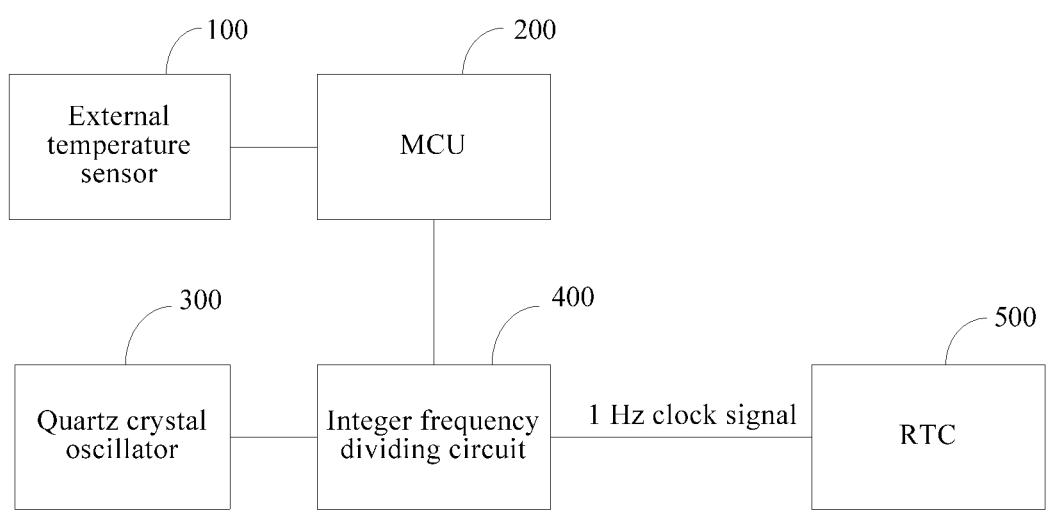
FIG. 1 is a schematic structural diagram of a common correction circuit.
Figure 2:
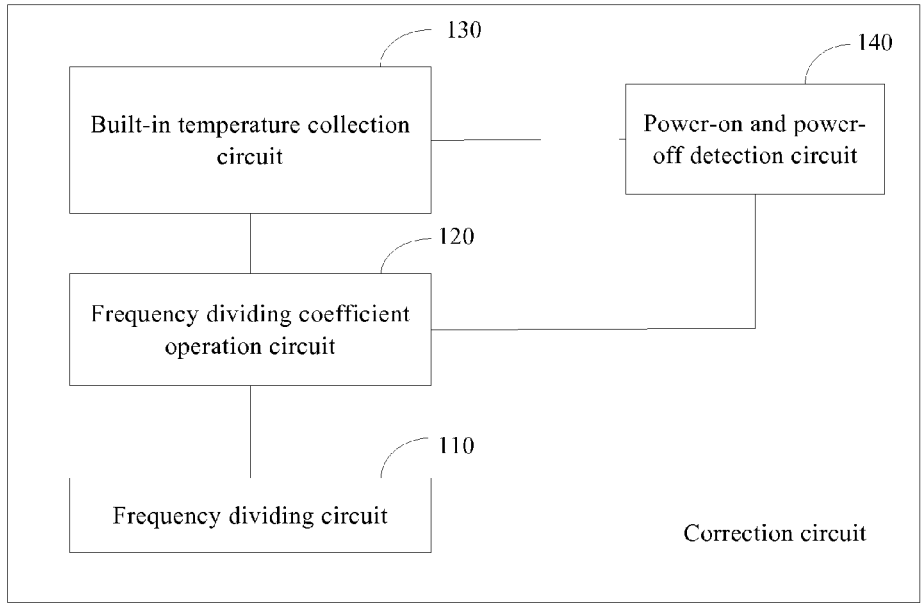
FIG. 2 is a schematic structural diagram of a first embodiment of a correction circuit according to the present invention.

FIG. 2 is a schematic structural diagram of a first embodiment of a correction circuit according to the present invention. The circuit in this embodiment applies to performing correction on a quartz crystal oscillator that provides a timing pulse for an RTC. Referring to FIG. 2, the correction circuit includes a frequency dividing circuit 110, a frequency dividing coefficient operation circuit 120, a built-in temperature collection circuit 130, and a power-on and power-off detection circuit 140, and these circuits are all integrated in a chip. The built-in temperature collection circuit 130 is configured to collect a temperature of the chip. The power-on and power-off detection circuit 140 is configured to detect whether the chip is powered off. The frequency dividing coefficient operation circuit 120 is configured to: when the power-on and power-off detection circuit 140 detects that the chip is powered off, calculate a frequency dividing coefficient according to the temperature of the chip collected by the built-in temperature collection circuit 130, and output the frequency dividing coefficient to the frequency dividing circuit 110. The frequency dividing circuit 110 is configured to provide a timing pulse for an RTC according to the frequency dividing coefficient output by the frequency dividing coefficient operation circuit 120, so that the clock outputs a clock signal according to the timing pulse.

In this embodiment, when the chip is powered on, power supply of the chip is used as a power supply source of the RTC; when the chip is powered off, an external battery is used as the power supply source of the RTC, for example, a button battery is generally used. Because power consumption of the RTC is extremely low, the external battery may meet a power supply requirement.

When the chip is powered off, only the RTC and the correction circuit are functioning inside, and power consumption of the RTC and the correction circuit is extremely low. Therefore, a temperature deviation between the temperature of the chip and the quartz crystal of the external quartz crystal oscillator is extremely little when the chip is powered off. Accordingly, when the chip is powered off, the temperature of the chip is used to calculate the frequency dividing coefficient instead of the temperature of the quartz crystal in this embodiment of the present invention. In addition, the frequency dividing circuit 110 may be an integer frequency dividing circuit or a fractional frequency dividing circuit.

In this embodiment, the built-in temperature collection circuit may collect the temperature of the chip when the chip is powered off, and send the temperature of the chip to the frequency dividing coefficient operation circuit to calculate a frequency dividing efficient. Therefore, the problem in the prior art that the frequency dividing coefficient cannot be acquired when the chip is powered off and clock correction cannot be performed is solved. Meanwhile, by using the built-in temperature collection circuit to collect a temperature, a problem that the chip cannot supply power to the external temperature sensor when powered off and temperature collection cannot be performed is resolved. In this embodiment, the frequency dividing coefficient required for correction is acquired by the frequency dividing coefficient operation circuit, which does not need to occupy MCU resources.

Further, the correction circuit in this embodiment may further include a temperature collection control circuit. The temperature collection control circuit is connected to the RTC and the built-in temperature collection circuit 130, and is configured to control, according to the clock signal output by the RTC, the built-in temperature collection circuit 130 to collect the temperature of the chip. Specifically, the temperature collection control circuit controls a time period used by the built-in temperature collection circuit 130 to collect a temperature. By using the temperature collection control circuit, a time period for temperature collection and a time period of the RTC may remain consistent, thereby improving accuracy of a timing clock.

Embodiment 2

Figure 3:
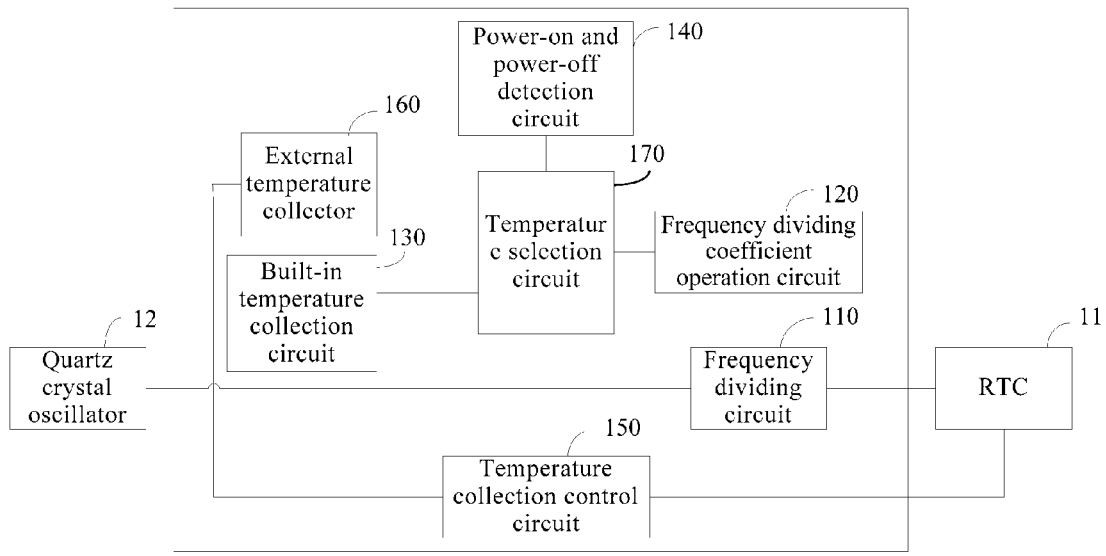
FIG. 3 is a schematic structural diagram of a second embodiment of a correction circuit according to the present invention.

FIG. 3 is a schematic structural diagram of a second embodiment of a correction circuit according to the present invention. Referring to FIG. 3, based on the first embodiment, to achieve correction when a chip is powered on, a power-on and power-off detection circuit 140 in this embodiment is further configured to detect whether the chip is powered on. The correction circuit further includes: an external temperature collector 160, configured to collect a temperature of an external quartz crystal oscillator 12 of the chip; a temperature selection circuit 170, connected to a built-in temperature collection circuit 130, the external temperature collector 160, the power-on and power-off detection circuit 140, and a frequency dividing coefficient operation circuit 120, and configured to: when the power-on and power-off detection circuit 140 detects that the chip is powered off, output the temperature of the chip collected by the built-in temperature collection circuit 130 to the frequency dividing coefficient operation circuit 120; and when the power-on and power-off detection circuit 140 detects that the chip is powered on, output a temperature of the quartz crystal collected by the external temperature collector 160 to the frequency dividing coefficient operation circuit 120.

Specifically, when the power-on and power-off detection circuit 140 detects that the chip is powered on, the temperature selection circuit 170 selects the temperature of the quartz crystal collected by the external temperature collector 160 and sends the temperature of the quartz crystal to the frequency dividing coefficient operation circuit 120; the frequency dividing coefficient operation circuit 120 outputs a corresponding frequency deviation according to an oscillation frequency and temperature characteristics of the quartz crystal and an input temperature, and sends a frequency dividing coefficient acquired according to the frequency deviation to the frequency dividing circuit 110; the frequency dividing circuit 110 performs, according to the frequency dividing coefficient, frequency dividing on the oscillation frequency output by the quartz crystal oscillator to acquire a timing pulse, where the timing pulse is input into an RTC 11. Further, except for completing timing work, meanwhile, the RTC 11 further provides a timing signal for a temperature collection control circuit 150, and the temperature collection control circuit 150 controls the built-in temperature collection circuit 130 and the external temperature collector 160, according to the timing signal, to collect temperatures.

When the chip is powered off, the RTC 11 may select an external battery to supply power. It should be noted that, because power consumption of the external temperature collector 160 is high, the external battery generally cannot meet a power supply requirement of the external temperature collector 160. Because the built-in temperature collection circuit 130 is a circuit integrated in a chip, power consumption of the circuit is extremely low, and therefore an external battery may meet the power supply requirement of the built-in temperature collection circuit 130.

In this embodiment that is based on the first embodiment, when the power-on and power-off detection circuit detects that the chip is powered on, the temperature of the quartz crystal in the quartz crystal oscillator collected by the external temperature collector is output to the frequency dividing coefficient operation circuit, thereby achieving clock correction according to a temperature when the chip is powered on.

Embodiment 3

Figure 4:
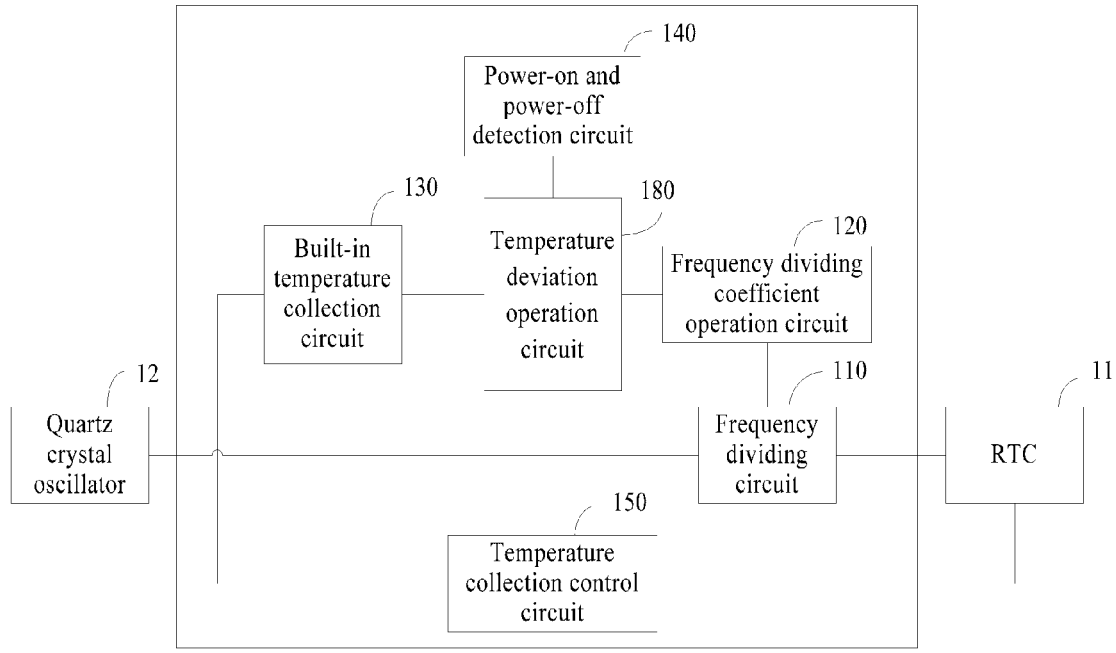
FIG. 4 is a schematic structural diagram of a third embodiment of a correction circuit according to the present invention.

FIG. 4 is a schematic structural diagram of a third embodiment of a correction circuit according to the present invention. Referring to FIG. 4, based on the first embodiment, to achieve correction when a chip is powered on, a power-on and power-off detection circuit 140 in this embodiment is further configured to detect whether the chip is powered on, and the correction circuit further includes: a temperature deviation operation circuit 180, connected to a built-in temperature collection circuit 130, the power-on and power-off detection circuit 140, and a frequency dividing coefficient operation circuit 120. The temperature deviation operation circuit 180 is configured to: when the power-on and power-off detection circuit 140 detects that the chip is powered off, output a temperature of the chip collected by the built-in temperature collection circuit 130 to the frequency dividing coefficient operation circuit 140; when the power-on and power-off detection circuit 140 detects that the chip is powered on, perform deviation compensation for the temperature of the chip collected by the built-in temperature collection circuit 130; and output a temperature acquired by using deviation compensation to the frequency dividing coefficient operation circuit 120.

Because internal power consumption of the chip is higher when the chip is powered on, a certain deviation exists between the temperature of the chip and a temperature of a quartz crystal. Therefore, in this embodiment, compensation is performed for the temperature of the chip collected by the built-in temperature collection circuit when the chip is powered on, and the temperature of the quartz crystal is acquired, thereby saving costs on an external temperature collector.

Further, the correction circuit in this embodiment may further include a temperature collection control circuit 150. The temperature collection control circuit is connected to an RTC and the built-in temperature collection circuit 130, and is configured to control, according to a clock signal output by the RTC, the built-in temperature collection circuit 130 to collect the temperature of the chip.

Based on any one of the foregoing embodiments, a relationship between an oscillation frequency and a temperature of the quartz crystal is shown in the following formula:

$$F=(K_s*(T-T_0)^2+l+C)*32768 \quad (1)$$

Where, F indicates the oscillation frequency of the quartz crystal at temperature T and the unit is Hz. Ks is a coefficient and is related to the selected quartz crystal. This embodiment uses an example that Ks is $-4*10^{-8}/°C.^2$ for description. $T_0$ is a center temperature, where the center temperature is a temperature corresponding to a center symmetry point in a relationship curve between the oscillation frequency and the temperature of the quartz crystal, and generally is 24.94° C. C is a frequency deviation between the quartz crystal frequency and 32.768 kilohertz at the center temperature. This embodiment uses an example that C is 0.

According to formula (1), the relationship between the temperature and the frequency deviation is obtained by subtracting 32768 from F in formula (1) and then dividing the value after the subtraction by 32768, as shown in formula (2):

$$F_{offset}=K_s*(T-T_0)^2+C \quad (2)$$

Where, $F_{offset}$ is a frequency deviation between the oscillation frequency of the quartz crystal and 32768 Hz at temperature T, and the unit is one in a million, that is, the frequency deviation of the frequency relative to a standard oscillation frequency at temperature T.

In the foregoing embodiment, the frequency dividing coefficient operation circuit 120 is specifically configured to acquire, according to a plurality of pre-saved temperatures and a frequency deviation of each temperature relative to the standard oscillation frequency, a frequency deviation corresponding to the input temperature, and output the frequency dividing coefficient, acquired from the frequency deviation corresponding to the input temperature, to the frequency dividing circuit 110; where the center temperature is a temperature corresponding to a center symmetry point in a relationship curve between the oscillation frequency and the temperature of the quartz crystal. The standard oscillation frequency is the oscillation frequency 32768 hertz of the quartz crystal, that is, 32.768 kilohertz.

Specifically, according to the relationship between the temperature and the frequency deviation shown in formula 2, certain temperatures and frequency deviations corresponding to the temperatures are pre-saved in the frequency dividing coefficient operation circuit 120. As listed in Table 1, a frequency corresponding to temperature −40/89.88 is 32762.4724 and a corresponding frequency deviation is −169, indicating that the oscillation frequency of the quartz crystal is 32762.4724 Hz at temperatures −40° C. and 89.88° C., and the frequency deviation relative to the standard oscillation frequency is −169 at both −40° C. and 89.88° C. When receiving an input temperature, the frequency dividing coefficient operation circuit 120 directly acquires, according to a pre-saved table, a frequency deviation relative to the standard oscillation frequency at the input temperature, as listed in Table 1. This improves the calculation efficiency by omitting an operation process. The input temperature may be the temperature of the quartz crystal collected by the external temperature collector or the temperature of the chip collected by the built-in temperature collection circuit.

TABLE 1

| Temperature | Frequency | Frequency deviation |
|---|---|---|
| −40/89.88 | 32762.4724 | −169 |
| −38.59/88.47 | 32762.7101 | −161 |
| −37.18/87.06 | 32762.9426 | −154 |
| −35.76/85.64 | 32763.1699 | −147 |
| −34.35/84.23 | 32763.3920 | −141 |
| −31.53/81.41 | 32763.8204 | −134 |
| −30.12/80 | 32764.0268 | −128 |
| −28.71/78.59 | 32764.2279 | −121 |
| −27.29/77.17 | 32764.4238 | −115 |
| −25.88/75.76 | 32764.6145 | −109 |
| −24.47/74.35 | 32764.8000 | −103 |
| −23.06/72.94 | 32767.9802 | −98 |
| −21.65/71.53 | 32765.1553 | −92 |
| −20.24/70.12 | 32765.3251 | −87 |
| −18.82/68.7 | 32765.4896 | −82 |
| −17.41/67.29 | 32765.649 | −77 |
| −16/65.88 | 32765.8031 | −72 |
| −14.59/64.47 | 32765.9520 | −67 |
| −13.18/63.06 | 32766.0957 | −62 |
| −11.76/61.64 | 32766.2342 | −58 |
| −10.35/60.23 | 32766.3674 | −54 |
| −8.94/58.82 | 32766.4954 | −50 |
| −7.53/57.41 | 32766.6182 | −46 |
| −6.12/56 | 32766.7357 | −39 |
| −4.71/54.59 | 32766.8480 | −35 |
| −3.29/53.17 | 32766.9551 | −32 |
| −1.88/51.76 | 32767.057 | −29 |
| −0.47/50.35 | 32767.1537 | −26 |
| 0.94/48.94 | 32767.2451 | −23 |
| 2.35/47.53 | 32767.3313 | −20 |
| 3.76/46.12 | 32767.4123 | −18 |
| 5.18/44.7 | 32767.4880 | −16 |
| 6.59/43.29 | 32767.5586 | −13 |
| 8/41.88 | 32767.6239 | −11 |
| 9.41/40.47 | 32767.6840 | −10 |
| 10.82/39.06 | 32767.7388 | −8 |
| 12.24/37.64 | 32767.7884 | −6 |
| 13.65/36.23 | 32767.8328 | −5 |
| 15.06/34.82 | 32767.8720 | −4 |
| 16.47/33.41 | 32767.9060 | −3 |
| 17.88/32 | 32767.9347 | −2 |
| 19.29/30.59 | 32767.9582 | −1 |
| 20.71/29.17 | 32767.9765 | −1 |
| 22.12/27.76 | 32767.9896 | 0 |
| 23.53/26.36 | 32767.9974 | 0 |
| 24.94 | 32768.0000 | 0 |

As listed in Table 1, if two temperatures are centrosymmetric related to the center temperature 24.94, an oscillation frequency of the quartz crystal is the same at two temperatures. For example, the oscillation frequency at temperature T1 17.88° C. in Table 1 is 32767.9347, and the oscillation frequency at temperature T2 that is centrosymmetric with T1 related to $T_0$, that is, T2 is 32° C., is also 32767.9347. This embodiment may save only a temperature and the corresponding frequency value, where the temperature falls within a range of temperatures that are higher than $T_0$, or may save only a temperature and the corresponding frequency value, where the temperature falls within a range of temperatures that are lower than $T_0$. A certain temperature point in a relationship curve between the oscillation frequency and the temperature of the quartz crystal shown in formula 1 and formula 2 may be obtained by interpolating two adjacent temperature points before and after the temperature point, thereby further reducing the number of saved temperatures and saving storage space.

Figure 5:
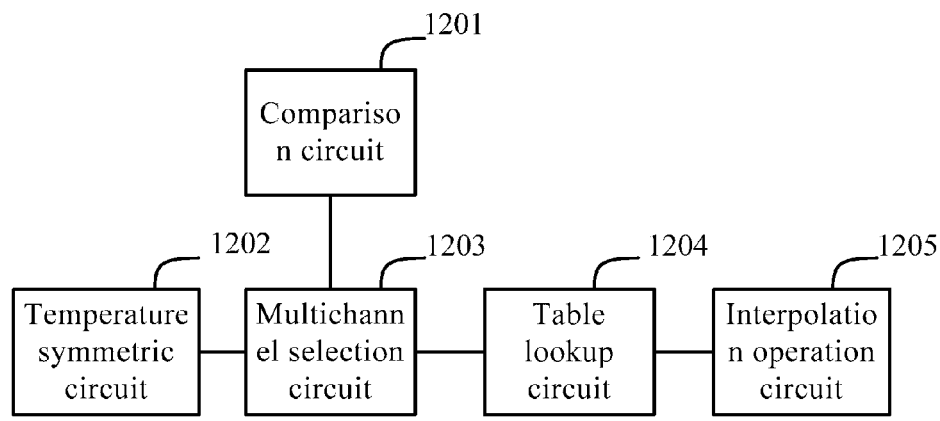
FIG. 5 is a schematic structural diagram of a frequency dividing coefficient operation circuit 120 of a correction circuit according to the present invention.

FIG. 5 is a schematic structural diagram of a frequency dividing coefficient operation circuit 120 of a correction circuit according to the present invention. With reference to FIG. 5, the frequency dividing coefficient operation circuit 120 includes a comparison circuit 1201, a temperature symmetric circuit 1202, a multichannel selection circuit 1203, a table lookup circuit 1204, and an interpolation operation circuit 1205.

The comparison circuit 1201 is configured to compare the input temperature with the center temperature.

The temperature symmetric circuit 1202 is configured to calculate a symmetric temperature of the input temperature related to the center temperature.

The multichannel selection circuit 1203 is connected to the comparison circuit 1201, the temperature symmetric circuit 1202, and the table lookup circuit 1204, and is configured to: output the temperature output by the temperature symmetric circuit 1202 to the table lookup circuit 1204 when the input temperature is higher than the center temperature and a plurality of the pre-saved temperatures are all lower than the center temperature or when the input temperature is lower than the center temperature and a plurality of the pre-saved temperatures are all higher than the center temperature; and otherwise, output the input temperature to the table lookup circuit 1204.

The table lookup circuit 1204 is connected to the multichannel selection circuit 1203 and the interpolation operation circuit 1205, and is configured to: look up a received temperature among a plurality of pre-saved temperatures; if the received temperature is found, output, to the interpolation operation circuit 1205, a frequency deviation corresponding to the received temperature relative to the standard oscillation frequency; and if not found, output, to the interpolation operation circuit 1205, frequency deviations of two temperatures related to the received temperature relative to the standard oscillation frequency.

The interpolation operation circuit 1205 is connected to the table lookup circuit 1204 and the frequency dividing circuit 110, and is configured to perform, according to the frequency deviation output by the table lookup circuit 1204, interpolation operation to acquire the frequency deviation corresponding to the input temperature, and output the frequency dividing coefficient, acquired according to the frequency deviation corresponding to the input temperature, to the frequency dividing circuit 110.

It should be noted that, for the table lookup circuit 1204, if the received temperature, that is, a symmetric temperature of the input temperature or the input temperature related to the center temperature is one of a plurality of the pre-saved temperatures, the two temperatures related to the received temperature are both the received temperature; otherwise, the two temperatures related to the received temperature are two adjacent temperatures of the received temperature among a plurality of the pre-saved temperatures.

Figure 6:
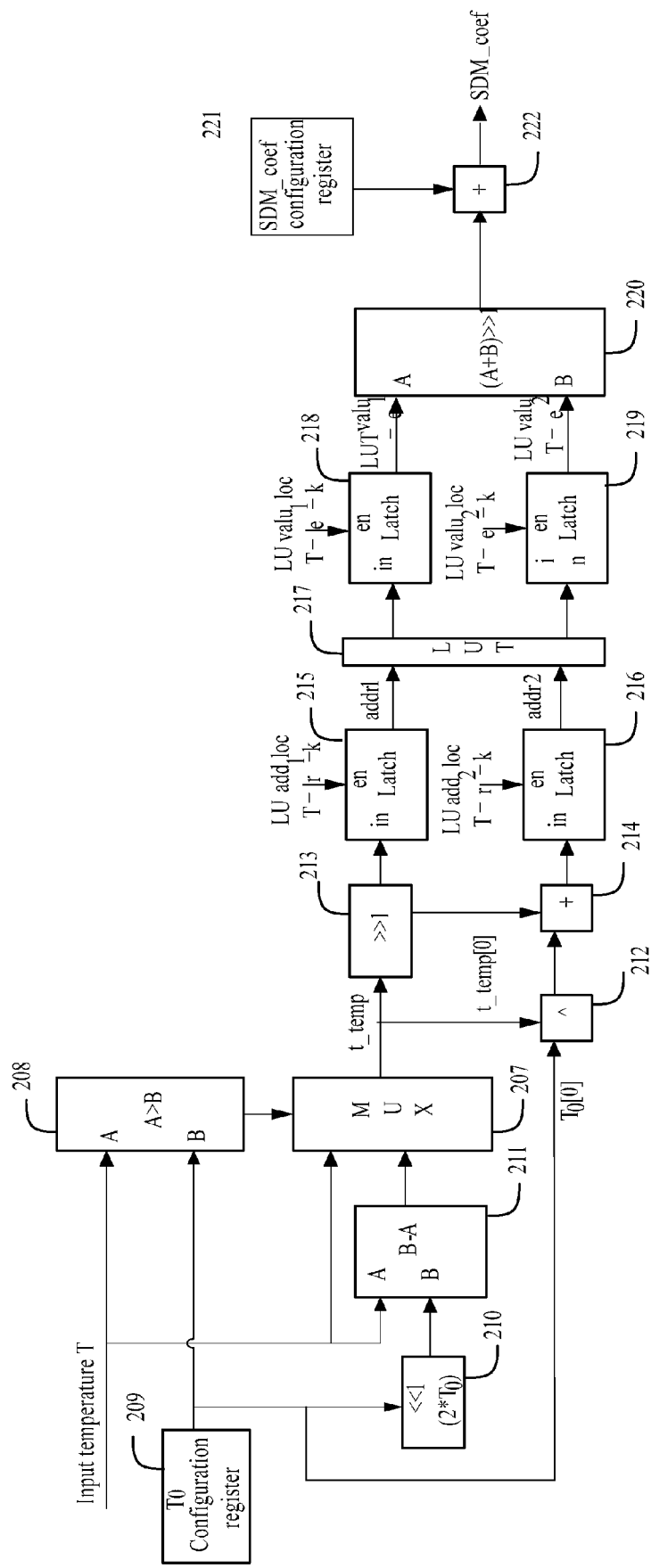
FIG. 6 is a circuit principle diagram of a frequency dividing coefficient operation circuit 120 of a correction circuit according to the present invention.

FIG. 6 is a circuit principle diagram of a frequency dividing coefficient operation circuit 120 of a correction circuit according to the present invention. Referring to FIG. 5 and FIG. 6, the comparison circuit 1201 includes a comparator 208 and a $T_0$ configuration register 209, and the temperature symmetric circuit 1202 includes a $T_0$ configuration register 209, a shifter 210, and a subtractor 211. For an input temperature T, the shifter 210 and the $T_0$ configuration register 209 calculate a symmetric temperature of T related to $T_0$ and the comparator 208 determines whether T is higher than $T_0$. The multichannel selection circuit 1203 includes a multi-input control selection circuit 207 and selects T or the symmetric temperature of T related to $T_0$, among signals sent by the comparator 208, as an output temperature t_temp. The table lookup circuit 1204 includes a bitwise exclusive-OR circuit 212, a shifter 213, a summator 214, a latch 215, a latch 216, and a look up table (Look Up Table, LUT for short) 217. Specifically, the bitwise exclusive-OR circuit 212 performs exclusive-OR on the least significant bit t_temp[0] of the output temperature t_temp of the multi-input control selection circuit 207 and the least significant bit $T_0[0]$ of $T_0$, the shifter performs shifting on the t_temp, and the latch 215 acquires, according to a shifting result, a register address add1 corresponding to a temperature that is pre-saved in the LUT 217 and is related to the input temperature, the summator 214 performs an adding operation on the exclusive-OR result or the shifting result, the latch 216 acquires, according to an adding result of the summator 214, a register address add2 corresponding to another temperature that is pre-saved in the LUT 217 and is related to the input temperature, and the LUT 217 outputs frequency deviations LUT_value1 and LUT_value2 respectively corresponding to the two temperatures related to the foregoing input temperature. The interpolation operation circuit 1205 includes a latch 218, a latch 219, and an operation unit 220. The operation unit 220 calculates an average value of the LUT_value1 and LUT_value2 to obtain an interpolation result, a positive number 2075 is stored in a SDM-coef configuration register 221 and is used to be added, in the summator 222, with a result of the operation unit 220, to obtain a frequency dividing coefficient SDM-coef that is finally output. Alternatively, because storage space of the LUT is 8 bits, that is, a storage range is −128 to 127, for frequency deviations corresponding to certain temperature points in the frequency deviations in Table 1 exceed −128, to facilitate implementation, a result that is obtained by adding a frequency deviation value corresponding to each temperature in Table 1 and 85 is stored in the LUT, and meanwhile, a positive number 1990 is stored in the SDM-coef configuration register 221.

In FIG. 6, LUT_addr1_lock, LUT_addr2_lock, LUT_value1_lock, and LUT_value2 lock are enable control signals that respectively control the latch 215, the latch 216, the latch 218, and the latch 219.

For ease of description, for example, a temperature code corresponding to the center temperature $T_0$, that is, 24.94, is presented as 01011100 in a binary format, and even temperatures such as 23.53 (the corresponding temperature code is 01011010 and an integer in a decimal format is 90), 22.12 (the corresponding temperature code is 01011000), 20.71 (the corresponding temperature code is 01010110), and 19.29 (the corresponding temperature code is 01010100) that are lower than $T_0$, and corresponding frequency deviations are pre-saved in the LUT 217. When the input temperature T is 24.24, the corresponding temperature code is 01011011, and the integer presented in a decimal format is 91, the comparator 208 determines that the input temperature 24.24 is lower than the center temperature 24.94, and sends a control signal, so that the multi-input control selection circuit 207 selects the input temperature 24.94, because the LUT 217 pre-saves frequency deviations corresponding to the temperature values that are lower than the center temperature. An exclusive-OR operation is performed on the least significant bits of the temperature code 01011011 and 01011100 corresponding to 24.24 and 24.94 to obtain a result 1. The summator 214 adds 1 and the temperature code 01011011 (the integer presented in a decimal format is 91) that corresponds to 24.24 and is shifted to the right by one bit to obtain 1011100, that is, 92 presented in a decimal format). Frequency deviations corresponding to two related temperatures 90 and 92 obtained in LUT 217 are both 85. The operation unit 220 calculates an average value of two 85 and the average value is 85, and the 1990 stored in the SDM-coef configuration register 221 is used for compensation. A finally-output result SDM-coef 2075 is a frequency dividing coefficient corresponding to the input temperature 21.

When the input temperature T is 23.53, the corresponding temperature code is 01011010, and the integer presented in a decimal format is 90, the comparator 208 determines that the input temperature 23.53 is lower than the center temperature 24.94, and sends a control signal, so that the multi-input control selection circuit 207 selects the input temperature 23.53, because the LUT 217 pre-saves frequency deviations corresponding to the temperature values that are lower than the center temperature. Temperature codes corresponding to 23.53 and 24.94 are respectively 01011010 and 01011100. An exclusive-OR operation is performed on the least significant bits of the temperature codes 01011010 and 01011100 to obtain a result 0. The summator 214 adds 0 and 90 that is the integer in a decimal format of 23.53 to obtain 90. Frequency deviations corresponding to the integer 90 in a decimal format and 90 obtained in the LUT 217 are respectively 85 and 85. The operation unit 220 calculates an average value, that is, 85, and the 1990 stored in the SDM-coef configuration register 221 is used for compensation. A finally-output result SDM-coef 2075 is a frequency dividing coefficient corresponding to the input temperature 23.53.

When the temperature is −24.47, the corresponding frequency dividing coefficient obtained by using the foregoing process is 1977. According to the foregoing operation process, frequency dividing coefficients corresponding to different input temperatures T may be obtained, which is not described repeatedly herein.

In this solution, a temperature symmetric circuit, a multi-channel selection circuit, and an interpolation operation circuit are used to achieve a frequency dividing coefficient operation circuit, which may further save storage capacity and improve the operation efficiency.

Figure 7:
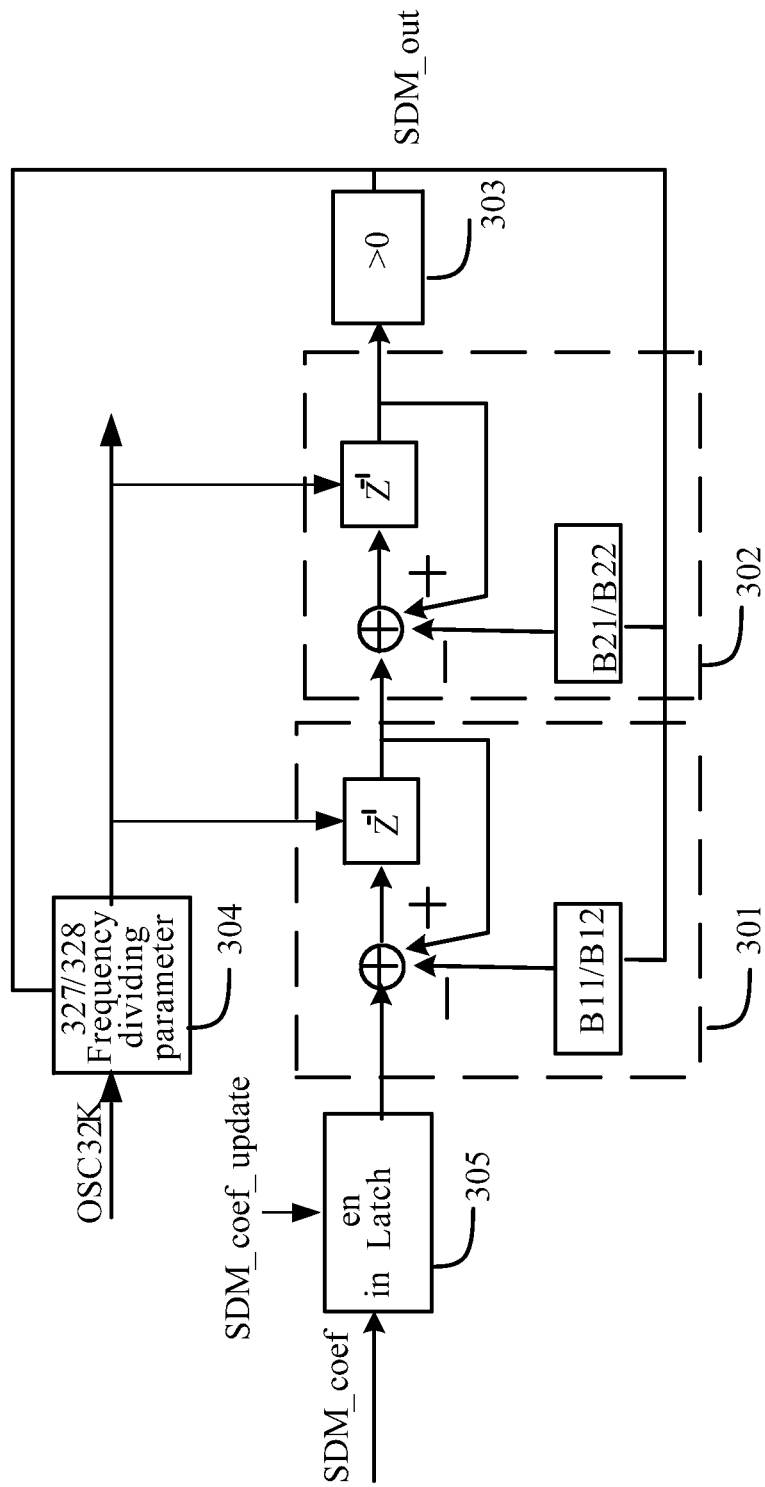
FIG. 7 is a circuit principle diagram of a fractional frequency dividing circuit of a correction circuit according to the present invention.

Based on the foregoing embodiments, a fractional frequency dividing circuit is preferably used as a frequency dividing circuit 110, and the fractional frequency dividing circuit includes a 2-level Sigma-Delta $\Sigma$-$\Delta$ modulator circuit and an integer frequency divider. FIG. 7 is a circuit principle diagram of a fractional frequency dividing circuit of a correction circuit according to the present invention. Referring to FIG. 7, the fractional frequency dividing circuit includes a level-1 $\Sigma$-$\Delta$ modulator circuit 301, a level-2 $\Sigma$-$\Delta$ modulator circuit 302, a comparator 303, an integer frequency divider 304, and a latch 305.

Frequency dividing parameters of the integer frequency divider 304 include 327 and 328.

The latch 305 is connected to the frequency dividing coefficient operation circuit 120, and the level-1 $\Sigma$-$\Delta$ modulator circuit 301 is connected to the latch 305 and the level-2 $\Sigma$-$\Delta$ modulation 302, where the 2-level $\Sigma$-$\Delta$ modulation is configured to perform $\Sigma$-$\Delta$ modulation on the frequency dividing coefficient SDM_coef; and SDM_coef_update is a control signal, from the control unit in the chip, for the latch 305.

The integer frequency divider 304 is connected to the comparator 303 and a quartz crystal oscillator 12 and compares an output result of the level-2 $\Sigma$-$\Delta$ modulator circuit 302 with 0 by using the comparator 303; when the result is greater than 0, the integer frequency divider 304 performs frequency dividing on a pulse signal OSC32K output by the quartz crystal oscillator 12 by using the frequency dividing parameter 328, the level-1 $\Sigma$-$\Delta$ modulator circuit uses an adjustment coefficient B11, and the level-1 $\Sigma$-$\Delta$ modulator circuit uses an adjustment coefficient B21; when the result is smaller than or equal to 0, the integer frequency divider 304 performs frequency dividing on a pulse signal output by the quartz crystal oscillator 12 by using the frequency dividing parameter 327, the level-1 Σ-Δ modulator circuit uses an adjustment coefficient B12, and the level-1 Σ-Δ modulator circuit uses an adjustment coefficient B22.

Using 3052, 6104, 0, and 0 as B11, B21, B12, and B22 respectively as an example, when a temperature is 24.94, an output frequency of the quartz crystal oscillator is 32768 Hz, and an obtained frequency dividing coefficient SDM_coef is equal to 2075. After an operation of the foregoing fractional frequency dividing circuit, 680 clock periods among the obtained 1000 clock periods use 328 for frequency dividing, and 320 clock periods use 327 for frequency dividing. Therefore, on average, a frequency dividing parameter of the 1000 clock periods is (680*328+320*327)/1000=327.68, and accordingly, an average frequency is 32768 Hz/327.68=100 Hz. For another example, when a temperature is −24.47, an output frequency of the quartz crystal oscillator is 32764.8 Hz, and an obtained frequency dividing coefficient is equal to 1977. After an operation of the foregoing fractional frequency dividing circuit, 648 clock periods among the obtained 1000 clock periods use 328 for frequency dividing, and 352 clock periods use 327 for frequency dividing. Therefore, on average, a frequency dividing parameter of the 1000 clock periods is (648*328+352*327)/1000=327.65, and accordingly, an average frequency is 32764.8 Hz/327.65≈100 Hz.

This solution uses a 2-level Sigma-Delta Σ-Δ modulator circuit to achieve a fractional frequency dividing circuit and output a 100 Hz clock pulse, thereby improving RTC timing precision.

Embodiment 4

Figure 8:
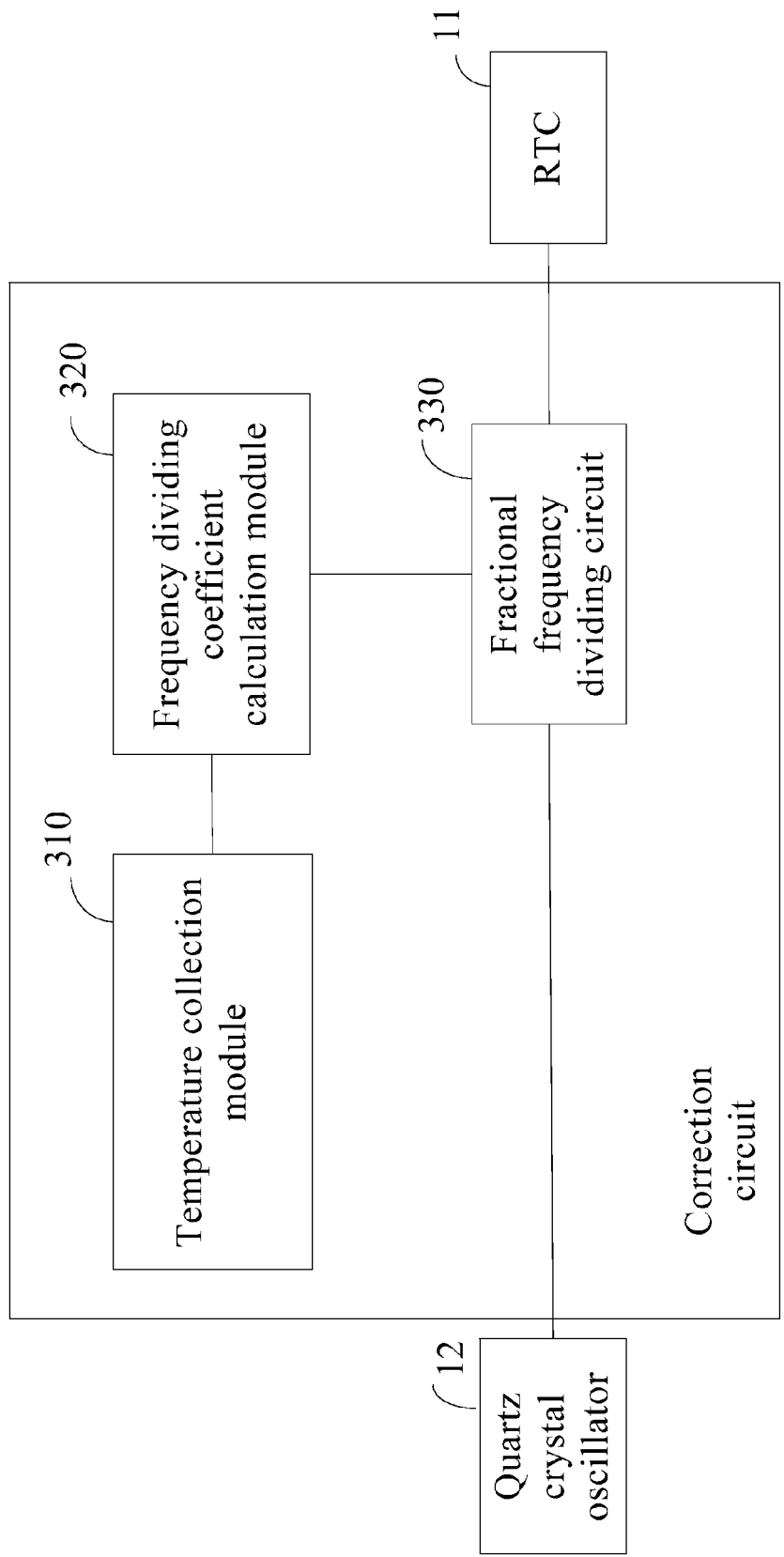
FIG. 8 is a schematic structural diagram of a fourth embodiment of a correction circuit according to the present invention.

FIG. 8 is a schematic structural diagram of a fourth embodiment of a correction circuit according to the present invention. The correction circuit provided in this embodiment includes a temperature collection module 310, a frequency dividing coefficient calculation module 320, and a fractional frequency dividing circuit 330. The temperature collection module 310 is configured to collect a temperature. The frequency dividing coefficient calculation module 320 is connected to the temperature collection module 310, and is configured to calculate a frequency dividing coefficient according to the temperature collected by the temperature collection module 310, and output the frequency dividing coefficient to the fractional frequency dividing circuit 330; and the fractional frequency dividing circuit 330 is connected to the frequency dividing coefficient calculation module 320 and a quartz crystal oscillator 12, and is configured to perform, according to the frequency dividing coefficient, fractional frequency dividing on a frequency output by the quartz crystal oscillator to obtain a timing pulse of a real-time clock 11.

The temperature collection module 310 may preferably use a circuit in the foregoing embodiments, for example, implemented by using a built-in temperature collection circuit, an external temperature collector, a temperature selection circuit, and a power-on and power-off detection circuit shown in FIG. 3, or implemented by using a built-in temperature collection circuit, a temperature deviation operation circuit, and a power-on and power-off detection circuit shown in FIG. 4.

In this embodiment, the fractional frequency dividing circuit 330 may preferably use a fractional frequency dividing circuit as shown in FIG. 7. It should be noted that, when the fractional frequency dividing circuit shown in FIG. 7 is used in this embodiment, a latch 305 is connected to the frequency dividing coefficient calculation module 320.

In this embodiment, by using a fractional frequency dividing circuit, a clock pulse signal is obtained for RTC timing. The clock pulse signal may be 10 Hz, 100 Hz, or the like. Therefore, timing precision is improved.

Embodiment 5

Figure 9:
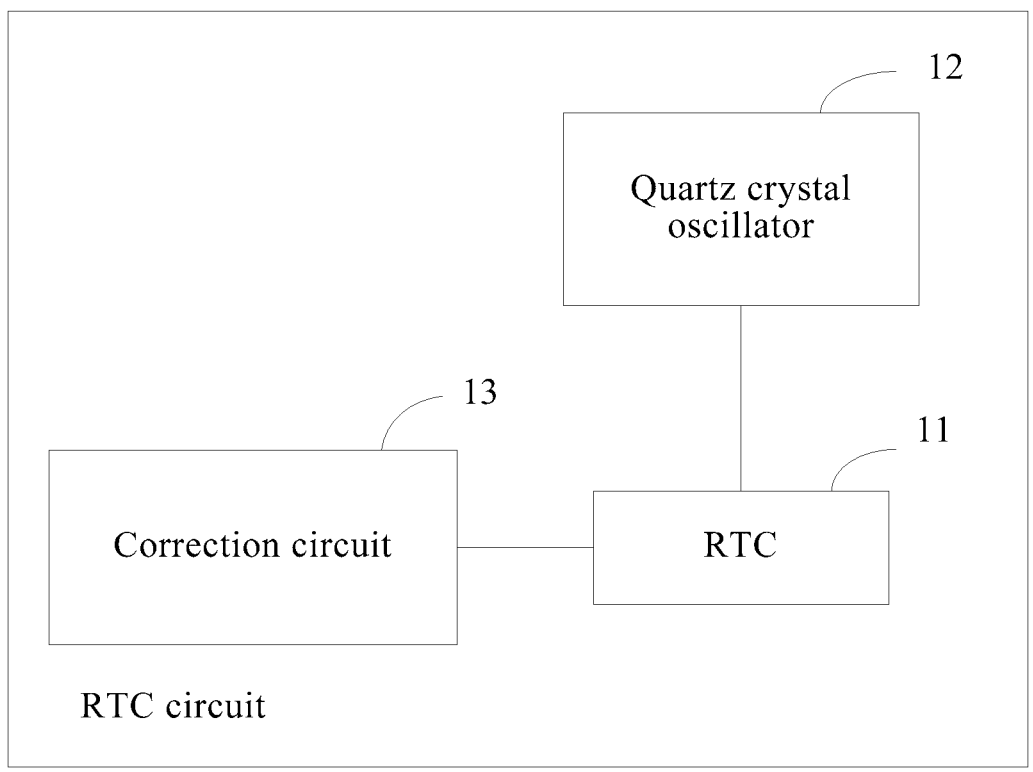
FIG. 9 is a schematic structural diagram of a first embodiment of an RTC circuit according to the present invention.

FIG. 9 is a schematic structural diagram of a first embodiment of an RTC circuit according to the present invention. This embodiment provides an RTC circuit, including a quartz crystal oscillator 12, a real-time clock 11, and a correction circuit 13, where the correction circuit 13 may use the correction circuit in any one of the foregoing embodiments. The quartz crystal oscillator includes a quartz crystal and an oscillator circuit.

Persons of ordinary skill in the art may understand that all or a part of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A correction circuit, comprising a frequency dividing circuit, a frequency dividing coefficient operation circuit, a built-in temperature collection circuit, and a power-on and power-off detection circuit that are all integrated in a chip; wherein
    the built-in temperature collection circuit is configured to collect a temperature of the chip;
    the power-on and power-off detection circuit is configured to detect power-on or power-off of the chip;
    the frequency dividing coefficient operation circuit is configured to: when the power-on and power-off detection circuit detects that the chip is powered off, calculate a frequency dividing coefficient according to the temperature of the chip collected by the built-in temperature collection circuit, and output the frequency dividing coefficient to the frequency dividing circuit; and
    the frequency dividing circuit is configured to provide, according to the frequency dividing coefficient output by the frequency dividing coefficient operation circuit, a timing pulse for a real-time clock, so that the real-time clock outputs a clock signal according to the timing pulse.

2. The correction circuit according to claim 1, further comprising:
    a temperature collection control circuit, connected to the real-time clock and the built-in temperature collection circuit, and configured to control, according to the clock signal output by the real-time clock, the built-in temperature collection circuit to collect the temperature of the chip.

3. The correction circuit according to claim 1, further comprising:
    an external temperature collector, configured to collect a temperature of an external quartz crystal of the chip; and a temperature selection circuit, connected to the built-in temperature collection circuit, the external temperature collector, the power-on and power-off detection circuit, and the frequency dividing coefficient operation circuit, and configured to: when the power-on and power-off detection circuit detects that the chip is powered off, output the temperature of the chip collected by the built-in temperature collection circuit to the frequency dividing coefficient operation circuit; and when the power-on and power-off detection circuit detects that the chip is powered on, output a temperature of the external quartz crystal collected by the external temperature collector to the frequency dividing coefficient operation circuit.

4. The correction circuit according to claim 3, wherein the temperature collection control circuit is further connected to the external temperature collector, and is further configured to control, according to a clock signal output by the real-time clock, the external temperature collector to collect the temperature of the external quartz crystal.

5. The correction circuit according to claim 1, further comprising:
a temperature deviation operation circuit, connected to the built-in temperature collection circuit, the power-on and power-off detection circuit, and the frequency dividing coefficient operation circuit, and configured to: when the power-on and power-off detection circuit detects that the chip is powered off, output the temperature of the chip collected by the built-in temperature collection circuit to the frequency dividing coefficient operation circuit; and when the power-on and power-off detection circuit detects that the chip is powered on, perform deviation compensation for the temperature of the chip collected by the built-in temperature collection circuit, and output a temperature acquired by using deviation compensation to the frequency dividing coefficient operation circuit.

6. The correction circuit according to claim 1, wherein the frequency dividing coefficient operation circuit is configured to: acquire, according to a plurality of pre-saved temperatures and a frequency deviation of each temperature relative to a standard oscillation frequency, a frequency deviation corresponding to an input temperature; and acquire, according to the frequency deviation corresponding to the input temperature, the frequency dividing coefficient, and output the frequency dividing coefficient to the frequency dividing circuit.

7. The correction circuit according to claim 6, wherein a plurality of the pre-saved temperatures are all higher than a center temperature or all lower than the center temperature, and the center temperature is a temperature corresponding to a center symmetry point in a relationship curve between the oscillation frequency and a temperature of the quartz crystal; and the frequency dividing coefficient operation circuit comprises a comparison circuit, a temperature symmetric circuit, a multichannel selection circuit, a table lookup circuit, and an interpolation operation circuit;
the comparison circuit is configured to compare the input temperature with the center temperature;
the temperature symmetric circuit is configured to calculate a symmetric temperature of the input temperature related to the center temperature;
the multichannel selection circuit is connected to the comparison circuit, the temperature symmetric circuit, and the table lookup circuit, and is configured to: output the corresponding temperature to the table lookup circuit when the input temperature is higher than the center temperature and a plurality of the pre-saved temperatures are all lower than the center temperature or when the input temperature is lower than the center temperature and a plurality of the pre-saved temperatures are all higher than the center temperature; and otherwise, output the input temperature to the table lookup circuit;
the table lookup circuit is connected to the multichannel selection circuit and the interpolation operation circuit, and is configured to: look up, according to a received temperature, among a plurality of the pre-saved temperatures and the frequency deviation of each temperature relative to the standard oscillation frequency; and output frequency deviations of two temperatures related to the received temperature, relative to the standard oscillation frequency, to the interpolation operation circuit; and
the interpolation operation circuit is connected to the table lookup circuit and the frequency dividing circuit, and is configured to: perform, according to the frequency deviations of the two temperatures output by the table lookup circuit, relative to the standard oscillation frequency, interpolation operation to acquire a frequency deviation corresponding to the input temperature; acquire, according to the frequency deviation corresponding to the input temperature, a frequency dividing coefficient; and output the frequency dividing coefficient to the frequency dividing circuit.

8. The correction circuit according to claim 1, wherein the frequency dividing circuit is a fractional frequency dividing circuit.

9. A correction circuit, comprising a temperature collection module, a frequency dividing coefficient calculation module, and a fractional frequency dividing circuit; wherein
the temperature collection module is configured to collect a temperature;
the frequency dividing coefficient calculation module is connected to the temperature collection module, and is configured to calculate a frequency dividing coefficient according to a temperature collected by the temperature collection module, and output the frequency dividing coefficient to the fractional frequency dividing circuit; and
the fractional frequency dividing circuit is connected to the frequency dividing coefficient calculation module and a quartz crystal oscillator, and is configured to perform, according to the frequency dividing coefficient, fractional frequency dividing on a frequency output by the quartz crystal oscillator to acquire a timing pulse of a real-time clock.

10. The correction circuit according to claim 9, wherein the fractional frequency dividing circuit comprises a 2-level Sigma-Delta $\Sigma$-$\Delta$ modulator circuit and an integer frequency divider, and a frequency dividing parameter of the integer frequency divider comprises 327 and 328; wherein
the 2-level $\Sigma$-$\Delta$ modulator circuit is connected to the frequency dividing coefficient calculation module; and
the integer frequency divider is connected to the 2-level Sigma-Delta $\Sigma$-$\Delta$ modulator circuit and an oscillator circuit, and is configured to: perform 328 frequency dividing on a pulse output by the quartz crystal oscillator by using a frequency dividing parameter 328 when a result output by the level-2 $\Sigma$-$\Delta$ modulator circuit is greater than 0; and perform 327 frequency dividing on the pulse output by the quartz crystal oscillator by using a frequency dividing parameter 327 when the result output by the level-2 $\Sigma$-$\Delta$ modulator circuit is smaller than or equal to 0.

* * * * *